US011617282B2

(12) United States Patent
Li

(10) Patent No.: US 11,617,282 B2
(45) Date of Patent: Mar. 28, 2023

(54) SYSTEM AND METHOD FOR RESHAPING POWER BUDGET OF CABINET TO FACILITATE IMPROVED DEPLOYMENT DENSITY OF SERVERS

(71) Applicant: Alibaba Group Holding Limited, Grand Cayman (KY)

(72) Inventor: Shu Li, Bothell, WA (US)

(73) Assignee: Alibaba Group Holding Limited, George Town (KY)

( * ) Notice: Subject to any disclaimer, the term of this patent is extended or adjusted under 35 U.S.C. 154(b) by 655 days.

(21) Appl. No.: 16/589,779

(22) Filed: Oct. 1, 2019

(65) Prior Publication Data
US 2021/0100126 A1   Apr. 1, 2021

(51) Int. Cl.
*H02J 9/06* (2006.01)
*G06F 1/26* (2006.01)
*G06F 1/28* (2006.01)
*G06F 1/30* (2006.01)
*H05K 7/14* (2006.01)

(52) U.S. Cl.
CPC .......... *H05K 7/1492* (2013.01); *G06F 1/263* (2013.01); *G06F 1/28* (2013.01); *G06F 1/30* (2013.01); *H02J 9/06* (2013.01); *H05K 7/1487* (2013.01)

(58) Field of Classification Search
CPC ..... H05K 7/14; H02J 9/06; G06F 1/26; G06F 1/28; G06F 1/30
See application file for complete search history.

(56) References Cited

U.S. PATENT DOCUMENTS

| 3,893,071 A | 7/1975 | Bossen |
| 4,562,494 A | 12/1985 | Bond |
| 4,718,067 A | 1/1988 | Peters |
| 4,858,040 A | 8/1989 | Hazebrouck |
| 5,394,382 A | 2/1995 | Hu |

(Continued)

FOREIGN PATENT DOCUMENTS

WO    9418634    8/1994

OTHER PUBLICATIONS

C. Wu, D. Wu, H. Chou and C. Cheng, "Rethink the Design of Flash Translation Layers in a Component-Based View", in IEEE Acess, vol. 5, pp. 12895-12912, 2017.

(Continued)

*Primary Examiner* — Mark A Connolly
(74) *Attorney, Agent, or Firm* — Shun Yao; Yao Legal Services, Inc.

(57) ABSTRACT

One embodiment provides a system and method for reshaping the power budget of a cabinet to facilitate an improved deployment density of servers. A battery cabinet comprises: a plurality of sealed batteries; a power outlet; and a power management module coupled to the sealed batteries and the power outlet. The power management module comprises: a power monitoring module configured to monitor a first amount of power consumed by one or more computing devices via a main power supply; a detection module configured to detect that the first amount of power consumption exceeds a predetermined power consumption threshold; and a power provision module configured to provide, via the sealed batteries, power to the power outlet until the first amount of power consumption no longer exceeds the predetermined power consumption threshold.

17 Claims, 10 Drawing Sheets

(56) References Cited

U.S. PATENT DOCUMENTS

| | | |
|---|---|---|
| 5,602,693 A | 2/1997 | Brunnett |
| 5,715,471 A | 2/1998 | Otsuka |
| 5,732,093 A | 3/1998 | Huang |
| 5,802,551 A | 9/1998 | Komatsu |
| 5,930,167 A | 7/1999 | Lee |
| 6,098,185 A | 8/2000 | Wilson |
| 6,148,377 A | 11/2000 | Carter |
| 6,457,104 B1 | 9/2002 | Tremaine |
| 6,658,478 B1 | 12/2003 | Singhal |
| 6,795,894 B1 | 9/2004 | Neufeld |
| 7,351,072 B2 | 4/2008 | Muff |
| 7,599,139 B1 | 10/2009 | Bombet |
| 7,953,899 B1 | 5/2011 | Hooper |
| 7,958,433 B1 | 6/2011 | Yoon |
| 8,024,719 B2 | 9/2011 | Gorton, Jr. |
| 8,085,569 B2 | 12/2011 | Kim |
| 8,144,512 B2 | 3/2012 | Huang |
| 8,166,233 B2 | 4/2012 | Schibilla |
| 8,281,061 B2 | 10/2012 | Radke |
| 8,527,544 B1 | 9/2013 | Colgrove |
| 8,819,367 B1 | 8/2014 | Fallone |
| 8,832,688 B2 | 9/2014 | Tang |
| 8,868,825 B1 | 10/2014 | Hayes |
| 8,904,061 B1 | 12/2014 | O'Brien, III |
| 9,015,561 B1 | 4/2015 | Hu |
| 9,031,296 B2 | 5/2015 | Kaempfer |
| 9,129,628 B1 | 9/2015 | Fallone |
| 9,141,176 B1 | 9/2015 | Chen |
| 9,208,817 B1 | 12/2015 | Li |
| 9,213,627 B2 | 12/2015 | Van Acht |
| 9,213,632 B1 | 12/2015 | Song |
| 9,251,058 B2 | 2/2016 | Nellans |
| 9,258,014 B2 | 2/2016 | Anderson |
| 9,311,939 B1 | 4/2016 | Malina |
| 9,336,340 B1 | 5/2016 | Dong |
| 9,436,595 B1 | 9/2016 | Benitez |
| 9,495,263 B2 | 11/2016 | Pang |
| 9,529,670 B2 | 12/2016 | O'Connor |
| 9,569,454 B2 | 2/2017 | Ebsen |
| 9,575,982 B1 | 2/2017 | Sankara Subramanian |
| 9,607,631 B2 | 3/2017 | Rausch |
| 9,671,971 B2 | 6/2017 | Trika |
| 9,722,632 B2 | 8/2017 | Anderson |
| 9,747,202 B1 | 8/2017 | Shaharabany |
| 9,830,084 B2 | 11/2017 | Thakkar |
| 9,836,232 B1 | 12/2017 | Vasquez |
| 9,852,076 B1 | 12/2017 | Garg |
| 9,875,053 B2 | 1/2018 | Frid |
| 9,910,705 B1 | 3/2018 | Mak |
| 9,912,530 B2 | 3/2018 | Singatwaria |
| 9,923,562 B1 | 3/2018 | Vinson |
| 9,933,973 B2 | 4/2018 | Luby |
| 9,946,596 B2 | 4/2018 | Hashimoto |
| 10,199,066 B1 | 2/2019 | Feldman |
| 10,229,735 B1 | 3/2019 | Natarajan |
| 10,235,198 B2 | 3/2019 | Qiu |
| 10,268,390 B2 | 4/2019 | Warfield |
| 10,318,467 B2 | 6/2019 | Barzik |
| 10,361,722 B2 | 7/2019 | Lee |
| 10,417,086 B2 | 9/2019 | Lin |
| 10,432,017 B1* | 10/2019 | Morales ............... H02J 7/0068 |
| 10,437,670 B1 | 10/2019 | Koltsidas |
| 10,459,663 B2 | 10/2019 | Agombar |
| 10,459,794 B2 | 10/2019 | Baek |
| 10,466,907 B2 | 11/2019 | Gole |
| 10,484,019 B2 | 11/2019 | Weinberg |
| 10,530,391 B2 | 1/2020 | Galbraith |
| 10,635,529 B2 | 4/2020 | Bolkhovitin |
| 10,642,522 B2 | 5/2020 | Li |
| 10,649,657 B2 | 5/2020 | Zaidman |
| 10,649,969 B2 | 5/2020 | De |
| 10,678,432 B1 | 6/2020 | Dreier |
| 10,756,816 B1 | 8/2020 | Dreier |
| 10,831,734 B2 | 11/2020 | Li |
| 10,928,847 B2 | 2/2021 | Suresh |
| 10,990,526 B1 | 4/2021 | Lam |
| 11,016,932 B2 | 5/2021 | Qiu |
| 11,023,150 B2 | 6/2021 | Pletka |
| 11,068,165 B2 | 7/2021 | Sharon |
| 11,068,409 B2 | 7/2021 | Li |
| 11,126,561 B2 | 9/2021 | Li |
| 11,138,124 B2 | 10/2021 | Tomic |
| 11,243,694 B2 | 2/2022 | Liang |
| 11,360,863 B2 | 6/2022 | Varadan |
| 2001/0003205 A1* | 6/2001 | Gilbert ............... G06F 1/266 713/320 |
| 2001/0032324 A1 | 10/2001 | Slaughter |
| 2001/0046295 A1 | 11/2001 | Sako |
| 2002/0039260 A1 | 4/2002 | Kilmer |
| 2002/0095403 A1 | 7/2002 | Chandrasekaran |
| 2002/0112085 A1 | 8/2002 | Berg |
| 2003/0145274 A1 | 7/2003 | Hwang |
| 2003/0217080 A1 | 11/2003 | White |
| 2004/0066741 A1 | 4/2004 | Dinker |
| 2004/0103238 A1 | 5/2004 | Avraham |
| 2004/0267752 A1 | 12/2004 | Wong |
| 2005/0138325 A1 | 6/2005 | Hofstee |
| 2005/0144358 A1 | 6/2005 | Conley |
| 2005/0149827 A1 | 7/2005 | Lambert |
| 2005/0174670 A1 | 8/2005 | Dunn |
| 2005/0177672 A1 | 8/2005 | Rao |
| 2006/0031709 A1 | 2/2006 | Hiraiwa |
| 2006/0101197 A1 | 5/2006 | Georgis |
| 2006/0156009 A1 | 7/2006 | Shin |
| 2006/0184813 A1 | 8/2006 | Bui |
| 2007/0061502 A1 | 3/2007 | Lasser |
| 2007/0204128 A1 | 8/2007 | Lee |
| 2007/0250756 A1 | 10/2007 | Gower |
| 2007/0266011 A1 | 11/2007 | Rohrs |
| 2007/0283081 A1 | 12/2007 | Lasser |
| 2007/0283104 A1 | 12/2007 | Wellwood |
| 2007/0285980 A1 | 12/2007 | Shimizu |
| 2008/0028223 A1 | 1/2008 | Rhoads |
| 2008/0065805 A1 | 3/2008 | Wu |
| 2008/0082731 A1 | 4/2008 | Karamcheti |
| 2008/0104369 A1 | 5/2008 | Reed |
| 2008/0112238 A1 | 5/2008 | Kim |
| 2008/0163033 A1 | 7/2008 | Yim |
| 2008/0195829 A1 | 8/2008 | Wilsey |
| 2008/0301532 A1 | 12/2008 | Uchikawa |
| 2009/0006667 A1 | 1/2009 | Lin |
| 2009/0089544 A1 | 4/2009 | Liu |
| 2009/0110078 A1 | 4/2009 | Crinon |
| 2009/0125788 A1 | 5/2009 | Wheeler |
| 2009/0177944 A1 | 7/2009 | Kanno |
| 2009/0183052 A1 | 7/2009 | Kanno |
| 2009/0254705 A1 | 10/2009 | Abali |
| 2009/0287956 A1 | 11/2009 | Flynn |
| 2009/0307426 A1 | 12/2009 | Galloway |
| 2010/0217952 A1 | 8/2010 | Iyer |
| 2010/0332922 A1 | 12/2010 | Chang |
| 2011/0031546 A1 | 2/2011 | Uenaka |
| 2011/0055471 A1 | 3/2011 | Thatcher |
| 2011/0060722 A1 | 3/2011 | Li |
| 2011/0099418 A1 | 4/2011 | Chen |
| 2011/0161621 A1 | 6/2011 | Sinclair |
| 2011/0161784 A1 | 6/2011 | Selinger |
| 2011/0191525 A1 | 8/2011 | Hsu |
| 2011/0239083 A1 | 9/2011 | Kanno |
| 2011/0252188 A1 | 10/2011 | Weingarten |
| 2011/0258514 A1 | 10/2011 | Lasser |
| 2011/0289263 A1 | 11/2011 | McWilliams |
| 2011/0289280 A1 | 11/2011 | Koseki |
| 2011/0296411 A1 | 12/2011 | Tang |
| 2011/0299317 A1 | 12/2011 | Shaeffer |
| 2011/0302432 A1* | 12/2011 | Harris ............... H02J 7/345 320/167 |
| 2012/0017037 A1 | 1/2012 | Riddle |
| 2012/0089774 A1 | 4/2012 | Kelkar |
| 2012/0096330 A1 | 4/2012 | Przybylski |
| 2012/0151253 A1 | 6/2012 | Horn |
| 2012/0159099 A1 | 6/2012 | Lindamood |
| 2012/0173792 A1 | 7/2012 | Lassa |
| 2012/0203958 A1 | 8/2012 | Jones |

(56) References Cited

U.S. PATENT DOCUMENTS

| | | |
|---|---|---|
| 2012/0324312 A1 | 12/2012 | Moyer |
| 2012/0331207 A1 | 12/2012 | Lassa |
| 2013/0013887 A1 | 1/2013 | Sugahara |
| 2013/0016970 A1 | 1/2013 | Koka |
| 2013/0018852 A1 | 1/2013 | Barton |
| 2013/0024605 A1 | 1/2013 | Sharon |
| 2013/0054822 A1 | 2/2013 | Mordani |
| 2013/0080391 A1 | 3/2013 | Raichstein |
| 2013/0138871 A1 | 5/2013 | Chiu |
| 2013/0179898 A1 | 7/2013 | Fang |
| 2013/0191601 A1 | 7/2013 | Peterson |
| 2013/0205183 A1 | 8/2013 | Fillingim |
| 2013/0227347 A1 | 8/2013 | Cho |
| 2013/0238955 A1 | 9/2013 | D Abreu |
| 2013/0254622 A1 | 9/2013 | Kanno |
| 2013/0329492 A1 | 12/2013 | Yang |
| 2014/0006688 A1 | 1/2014 | Yu |
| 2014/0019650 A1 | 1/2014 | Li |
| 2014/0025638 A1 | 1/2014 | Hu |
| 2014/0082273 A1 | 3/2014 | Segev |
| 2014/0082412 A1 | 3/2014 | Matsumura |
| 2014/0095758 A1 | 4/2014 | Smith |
| 2014/0095769 A1 | 4/2014 | Borkenhagen |
| 2014/0095827 A1 | 4/2014 | Wei |
| 2014/0108891 A1 | 4/2014 | Strasser |
| 2014/0164447 A1 | 6/2014 | Tarafdar |
| 2014/0164879 A1 | 6/2014 | Tam |
| 2014/0195564 A1 | 7/2014 | Talagala |
| 2014/0215129 A1 | 7/2014 | Kuzmin |
| 2014/0223079 A1 | 8/2014 | Zhang |
| 2014/0279927 A1 | 9/2014 | Constantinescu |
| 2014/0337457 A1 | 11/2014 | Nowoczynski |
| 2014/0379965 A1 | 12/2014 | Gole |
| 2015/0006792 A1 | 1/2015 | Lee |
| 2015/0039849 A1 | 2/2015 | Lewis |
| 2015/0067436 A1 | 3/2015 | Hu |
| 2015/0121031 A1 | 4/2015 | Feng |
| 2015/0143030 A1 | 5/2015 | Gorobets |
| 2015/0186657 A1 | 7/2015 | Nakhjiri |
| 2015/0199234 A1 | 7/2015 | Choi |
| 2015/0234845 A1 | 8/2015 | Moore |
| 2015/0269964 A1 | 9/2015 | Fallone |
| 2015/0286477 A1 | 10/2015 | Mathur |
| 2015/0294684 A1 | 10/2015 | Qjang |
| 2015/0301964 A1 | 10/2015 | Brinicombe |
| 2015/0310916 A1 | 10/2015 | Leem |
| 2015/0317095 A1 | 11/2015 | Voigt |
| 2015/0341123 A1 | 11/2015 | Nagarajan |
| 2015/0347025 A1 | 12/2015 | Law |
| 2015/0363271 A1 | 12/2015 | Haustein |
| 2015/0363328 A1 | 12/2015 | Candelaria |
| 2016/0026575 A1 | 1/2016 | Samanta |
| 2016/0041760 A1 | 2/2016 | Kuang |
| 2016/0048327 A1 | 2/2016 | Jayasena |
| 2016/0048341 A1 | 2/2016 | Constantinescu |
| 2016/0054922 A1 | 2/2016 | Awasthi |
| 2016/0062885 A1 | 3/2016 | Ryu |
| 2016/0077749 A1 | 3/2016 | Ravimohan |
| 2016/0077764 A1 | 3/2016 | Ori |
| 2016/0077968 A1 | 3/2016 | Sela |
| 2016/0078245 A1 | 3/2016 | Amarendran |
| 2016/0098350 A1 | 4/2016 | Tang |
| 2016/0103631 A1 | 4/2016 | Ke |
| 2016/0109916 A1* | 4/2016 | Li .................. H02J 7/35 700/295 |
| 2016/0124742 A1 | 5/2016 | Rangasamy |
| 2016/0132237 A1 | 5/2016 | Jeong |
| 2016/0141047 A1 | 5/2016 | Sehgal |
| 2016/0154601 A1 | 6/2016 | Chen |
| 2016/0155750 A1 | 6/2016 | Yasuda |
| 2016/0162187 A1 | 6/2016 | Lee |
| 2016/0179399 A1 | 6/2016 | Melik-Martirosian |
| 2016/0203000 A1 | 7/2016 | Parmar |
| 2016/0224267 A1 | 8/2016 | Yang |
| 2016/0234297 A1 | 8/2016 | Ambach |
| 2016/0283140 A1 | 9/2016 | Kaushik |
| 2016/0306699 A1 | 10/2016 | Resch |
| 2016/0321002 A1 | 11/2016 | Jung |
| 2016/0335085 A1 | 11/2016 | Scalabrino |
| 2016/0342345 A1 | 11/2016 | Kankani |
| 2016/0350385 A1 | 12/2016 | Poder |
| 2016/0364146 A1 | 12/2016 | Kuttner |
| 2016/0381442 A1 | 12/2016 | Heanue |
| 2017/0004037 A1 | 1/2017 | Park |
| 2017/0010652 A1 | 1/2017 | Huang |
| 2017/0068639 A1 | 3/2017 | Davis |
| 2017/0091110 A1 | 3/2017 | Ash |
| 2017/0109199 A1 | 4/2017 | Chen |
| 2017/0123655 A1 | 5/2017 | Sinclair |
| 2017/0147499 A1 | 5/2017 | Mohan |
| 2017/0161202 A1 | 6/2017 | Erez |
| 2017/0177217 A1 | 6/2017 | Kanno |
| 2017/0177259 A1 | 6/2017 | Motwani |
| 2017/0185316 A1 | 6/2017 | Nieuwejaar |
| 2017/0185498 A1 | 6/2017 | Gao |
| 2017/0192848 A1 | 7/2017 | Pamies-Juarez |
| 2017/0199823 A1 | 7/2017 | Hayes |
| 2017/0212680 A1 | 7/2017 | Waghulde |
| 2017/0220254 A1 | 8/2017 | Warfield |
| 2017/0221519 A1 | 8/2017 | Matsuo |
| 2017/0242722 A1 | 8/2017 | Qiu |
| 2017/0262217 A1 | 9/2017 | Pradhan |
| 2017/0269998 A1 | 9/2017 | Sunwoo |
| 2017/0277655 A1 | 9/2017 | Das |
| 2017/0279460 A1 | 9/2017 | Camp |
| 2017/0322888 A1 | 11/2017 | Booth |
| 2018/0024779 A1 | 1/2018 | Kojima |
| 2018/0033491 A1 | 2/2018 | Marelli |
| 2018/0052797 A1 | 2/2018 | Barzik |
| 2018/0059754 A1* | 3/2018 | Shaikh .................. H02J 1/001 |
| 2018/0067847 A1 | 3/2018 | Oh |
| 2018/0069658 A1 | 3/2018 | Benisty |
| 2018/0074730 A1 | 3/2018 | Inoue |
| 2018/0076828 A1 | 3/2018 | Kanno |
| 2018/0107591 A1 | 4/2018 | Smith |
| 2018/0113631 A1 | 4/2018 | Zhang |
| 2018/0165038 A1 | 6/2018 | Authement |
| 2018/0165169 A1 | 6/2018 | Camp |
| 2018/0165340 A1 | 6/2018 | Agarwal |
| 2018/0173620 A1 | 6/2018 | Cen |
| 2018/0188970 A1 | 7/2018 | Liu |
| 2018/0189175 A1 | 7/2018 | Ji |
| 2018/0212951 A1 | 7/2018 | Goodrum |
| 2018/0219561 A1 | 8/2018 | Litsyn |
| 2018/0226124 A1 | 8/2018 | Perner |
| 2018/0232151 A1 | 8/2018 | Badam |
| 2018/0260148 A1 | 9/2018 | Klein |
| 2018/0293014 A1 | 10/2018 | Ravimohan |
| 2018/0300203 A1 | 10/2018 | Kathpal |
| 2018/0307620 A1 | 10/2018 | Zhou |
| 2018/0321864 A1 | 11/2018 | Benisty |
| 2018/0322024 A1 | 11/2018 | Nagao |
| 2018/0336921 A1 | 11/2018 | Ryun |
| 2018/0356992 A1 | 12/2018 | Lamberts |
| 2018/0357126 A1 | 12/2018 | Dhuse |
| 2018/0373655 A1 | 12/2018 | Liu |
| 2018/0373664 A1 | 12/2018 | Vijayrao |
| 2019/0034454 A1 | 1/2019 | Gangumalla |
| 2019/0041934 A1* | 2/2019 | Tan .................. G06F 1/266 |
| 2019/0042571 A1 | 2/2019 | Li |
| 2019/0050312 A1 | 2/2019 | Li |
| 2019/0050327 A1 | 2/2019 | Li |
| 2019/0065085 A1 | 2/2019 | Jean |
| 2019/0073261 A1 | 3/2019 | Halbert |
| 2019/0087089 A1 | 3/2019 | Yoshida |
| 2019/0087115 A1 | 3/2019 | Li |
| 2019/0087328 A1 | 3/2019 | Kanno |
| 2019/0108145 A1 | 4/2019 | Raghava |
| 2019/0116127 A1 | 4/2019 | Pismenny |
| 2019/0166725 A1 | 5/2019 | Jing |
| 2019/0171532 A1 | 6/2019 | Abadi |
| 2019/0172820 A1 | 6/2019 | Meyers |
| 2019/0196748 A1 | 6/2019 | Badam |
| 2019/0196907 A1 | 6/2019 | Khan |

(56) References Cited

U.S. PATENT DOCUMENTS

| | | |
|---|---|---|
| 2019/0205206 A1 | 7/2019 | Hornung |
| 2019/0212949 A1 | 7/2019 | Pletka |
| 2019/0220392 A1 | 7/2019 | Lin |
| 2019/0227927 A1 | 7/2019 | Miao |
| 2019/0272242 A1 | 9/2019 | Kachare |
| 2019/0278654 A1 | 9/2019 | Kaynak |
| 2019/0278849 A1 | 9/2019 | Chandramouli |
| 2019/0317901 A1 | 10/2019 | Kachare |
| 2019/0320020 A1 | 10/2019 | Lee |
| 2019/0339998 A1 | 11/2019 | Momchilov |
| 2019/0361611 A1 | 11/2019 | Hosogi |
| 2019/0377632 A1 | 12/2019 | Oh |
| 2019/0377821 A1 | 12/2019 | Pleshachkov |
| 2019/0391748 A1 | 12/2019 | Li |
| 2020/0004456 A1 | 1/2020 | Williams |
| 2020/0004674 A1 | 1/2020 | Williams |
| 2020/0013458 A1 | 1/2020 | Schreck |
| 2020/0042223 A1 | 2/2020 | Li |
| 2020/0042387 A1 | 2/2020 | Shani |
| 2020/0082006 A1 | 3/2020 | Rupp |
| 2020/0084918 A1 | 3/2020 | Shen |
| 2020/0089430 A1 | 3/2020 | Kanno |
| 2020/0092209 A1 | 3/2020 | Chen |
| 2020/0097189 A1 | 3/2020 | Tao |
| 2020/0133841 A1 | 4/2020 | Davis |
| 2020/0143885 A1 | 5/2020 | Kim |
| 2020/0159425 A1 | 5/2020 | Flynn |
| 2020/0167091 A1 | 5/2020 | Haridas |
| 2020/0210309 A1 | 7/2020 | Jung |
| 2020/0218449 A1 | 7/2020 | Leitao |
| 2020/0225875 A1 | 7/2020 | Oh |
| 2020/0242021 A1 | 7/2020 | Gholamipour |
| 2020/0250032 A1 | 8/2020 | Goyal |
| 2020/0257598 A1 | 8/2020 | Yazovitsky |
| 2020/0322287 A1 | 10/2020 | Connor |
| 2020/0326855 A1 | 10/2020 | Wu |
| 2020/0328192 A1 | 10/2020 | Zaman |
| 2020/0348888 A1 | 11/2020 | Kim |
| 2020/0364094 A1 | 11/2020 | Kahle |
| 2020/0371955 A1 | 11/2020 | Goodacre |
| 2020/0387327 A1 | 12/2020 | Hsieh |
| 2020/0401093 A1* | 12/2020 | Song .................... G06F 9/5066 |
| 2020/0401334 A1 | 12/2020 | Saxena |
| 2020/0409559 A1 | 12/2020 | Sharon |
| 2020/0409791 A1 | 12/2020 | Devriendt |
| 2021/0010338 A1 | 1/2021 | Santos |
| 2021/0064109 A1* | 3/2021 | Tandon .............. G06F 11/3062 |
| 2021/0075633 A1 | 3/2021 | Sen |
| 2021/0089392 A1 | 3/2021 | Shirakawa |
| 2021/0103388 A1 | 4/2021 | Choi |
| 2021/0124488 A1 | 4/2021 | Stoica |
| 2021/0132999 A1 | 5/2021 | Haywood |
| 2021/0191635 A1 | 6/2021 | Hu |
| 2021/0263795 A1 | 8/2021 | Li |
| 2021/0286555 A1 | 9/2021 | Li |

OTHER PUBLICATIONS

Po-Liang Wu, Yuan-Hao Chang and T. Kuo, "A file-system-aware FTL design for flash-memory storage systems," 2009, pp. 393-398.

S. Choudhuri and T. Givargis, "Preformance improvement of block based NAND flash translation layer", 2007 5th IEEE/ACM/IFIP International Conference on Hardware/Software Codesign and Systems Synthesis (CODES+ISSS). Saizburg, 2007, pp. 257-262.

A. Zuck, O. Kishon and S. Toledo. "LSDM: Improving the Preformance of Mobile Storage with a Log-Structured Address Remapping Device Driver", 2014 Eighth International Conference on Next Generation Mobile Apps, Services and Technologies, Oxford, 2014, pp. 221-228.

J. Jung and Y. Won, "nvramdisk: A Transactional Block Device Driver for Non-Volatile RAM", in IEEE Transactions on Computers, vol. 65, No. 2, pp. 589-600, Feb. 1, 2016.

Te I et al. (Pensieve: a Machine Assisted SSD Layer for Extending the Lifetime: (Year: 2018).

ARM ("Cortex-R5 and Cortex-R5F", Technical reference Manual, Revision r1p1) (Year:2011).

S. Hong and D. Shin, "NAND Flash-Based Disk Cache Using SLC/MLC Combined Flash Memory," 2010 International Workshop on Storage Network Architecture and Parallel I/Os, Incline Village, NV, 2010, pp. 21-30.

Arpaci-Dusseau et al. "Operating Systems: Three Easy Pieces", Originally published 2015; Pertinent: Chapter 44; flash-based SSDs, available at http://pages.cs.wisc.edu/~remzi/OSTEP/.

Jimenex, X., Novo, D. and P. Ienne, "Pheonix:Reviving MLC Blocks as SLC to Extend NAND Flash Devices Lifetime," Design, Automation & Text in Europe Conference & Exhibition (Date), 2013.

Yang, T. Wu, H. and W. Sun, "GD-FTL: Improving the Performance and Lifetime of TLC SSD by Downgrading Worn-out Blocks," IEEE 37th International Performance Computing and Communications Conference (IPCCC), 2018.

* cited by examiner

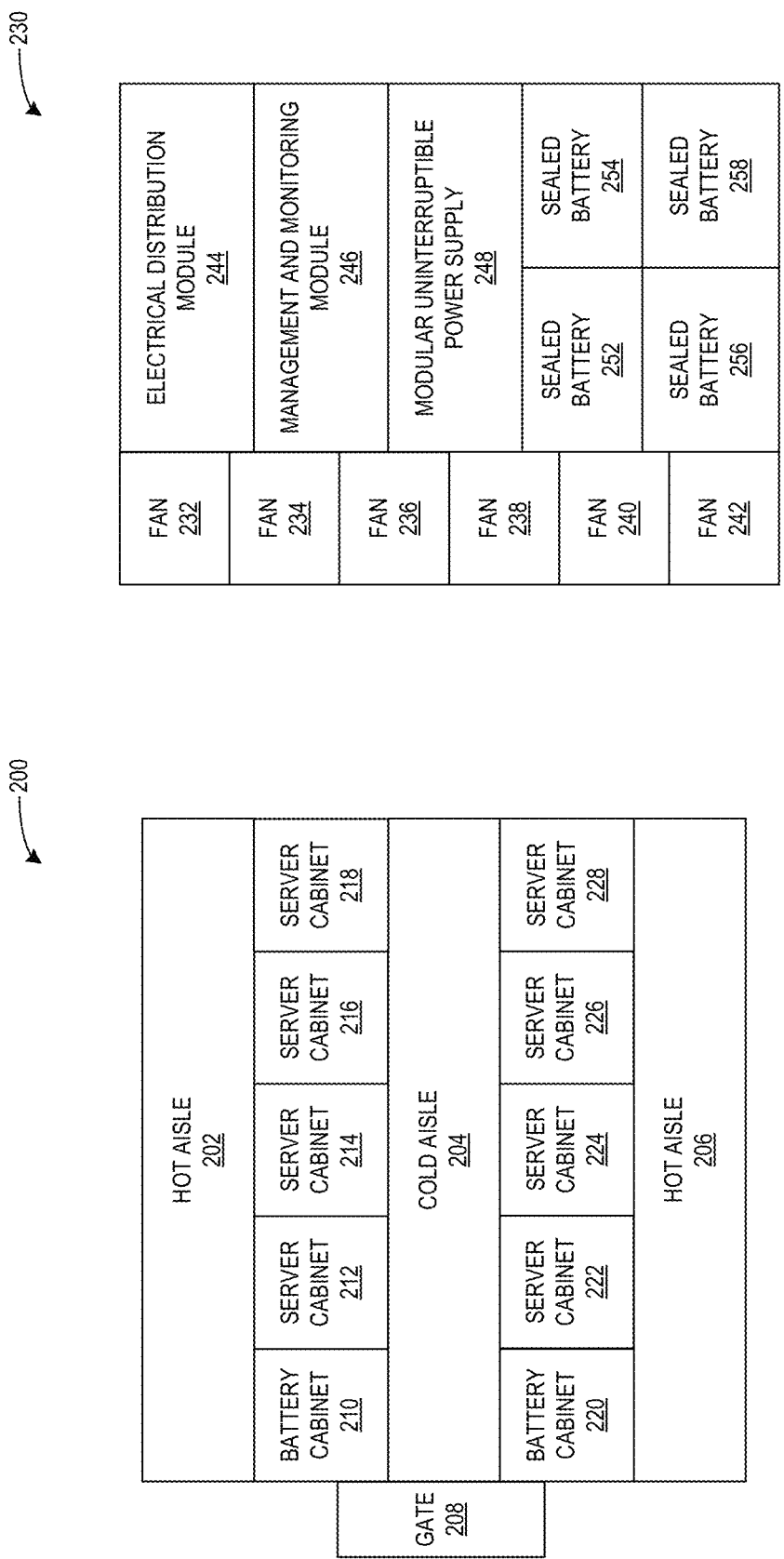

SYSTEM AND METHOD FOR RESHAPING POWER BUDGET OF CABINET TO FACILITATE IMPROVED DEPLOYMENT DENSITY OF SERVERS

BACKGROUND

Field

This disclosure is generally related to the field of data storage. More specifically, this disclosure is related to a system for reshaping the power budget of a cabinet for facilitating an improved deployment density of servers in the cabinet.

Related Art

The proliferation of the Internet and e-commerce continues to create a vast amount of digital content. Furthermore, given the current pace of development of infrastructure technology, deployed equipment (e.g., in data centers) continues to consume an increasing amount of power. For example, a data center cabinet can include multiple computing devices, such as servers, switches, and hard disks like just a bunch of disks (JBODs). Some application scenarios may result in high peak power consumption for a short period of time by the computing devices in the cabinet. The power consumed during such peak periods may not match the power allocated or budgeted to the cabinet. This can result in a power reset or a blow-out, which can significantly affect the reliability of the infrastructure, including the overall reliability of a data center.

SUMMARY

One embodiment provides a system and method for reshaping the power budget of a cabinet to facilitate an improved deployment density of servers. A battery cabinet comprises: a plurality of sealed batteries; a power outlet; and a power management module coupled to the sealed batteries and the power outlet. The power management module comprises: a power monitoring module configured to monitor a first amount of power consumed by one or more computing devices via a main power supply; a detection module configured to detect that the first amount of power consumption exceeds a predetermined power consumption threshold; and a power provision module configured to provide, via the sealed batteries, power to the power outlet until the first amount of power consumption no longer exceeds the predetermined power consumption threshold.

In some embodiments, the battery cabinet is part of a system comprising the battery cabinet and further comprises a plurality of server cabinets co-located with the battery cabinet, wherein a respective server cabinet includes at least one of the computing devices.

In some embodiments, the battery cabinet further comprises: a plurality of fans; and a modular uninterruptible power supply unit coupled to the power management module and configured to draw power from the sealed batteries and provide the drawn power via the power outlet to the one or more computing devices.

In some embodiments, a respective sealed battery comprises a plurality of parallel battery strings, and a respective battery string comprises: battery cells; a plurality of pairs comprised of the battery cells and corresponding switches, wherein the plurality of pairs is coupled to a ground, and wherein a first battery cell and a corresponding first switch comprise a respective pair in the plurality of pairs; and a voltage regulator module coupled to the plurality of pairs. The first switch is configured to bypass the first battery cell in response to a failure of the first battery cell.

In some embodiments, the battery cells comprise functioning battery cells from retired batteries. A respective retired battery is previously used in one or more of: an industrial context; an electric vehicle; a hybrid vehicle; and a manner which leaves some non-functioning battery cells and at least one functioning battery cell in the respective retired battery.

In some embodiments, the detection module is further configured to determine a predetermined period of low power consumption. In response to the detection module determining the predetermined period of low power consumption, the power provision module is further configured to charge the sealed batteries by pulling power from the main power supply.

In some embodiments, the predetermined period of low power consumption corresponds to a least expensive electricity rate.

In some embodiments, in response to the detection module determining the predetermined period of low power consumption, the power provision module is further configured to charge the sealed batteries by pulling power from the main power supply and from a renewable power supply.

In some embodiments, the renewable power supply includes one or more of: wind power; rainfall power; water-related power; solar energy; and tidal power.

In some embodiments, the renewable power supply is generated from a source which is located within a predetermined distance from the battery cabinet.

One embodiment provides a data center. The data center comprises: a plurality of battery cabinets; a plurality of server cabinets coupled to at least one of the battery cabinets; a processor; and a memory coupled to the processor and storing instructions, which when executed by the processor cause the processor to perform a method. A respective battery cabinet comprises a plurality of sealed batteries and a power management module which is coupled to the plurality of sealed batteries and a power outlet. A respective server cabinet comprises a plurality of computing devices. The method comprises: monitoring a first amount of power consumed by one or more computing devices via a main power supply; detecting that the first amount of power consumption exceeds a predetermined power consumption threshold; and providing, via the plurality of sealed batteries, power to the power outlet until the first amount of power consumption no longer exceeds the predetermined power consumption threshold.

BRIEF DESCRIPTION OF THE FIGURES

FIG. 2A illustrates an exemplary pod or group of computing devices in a data center, including a battery cabinet which provides additional power to co-located server cabinets, in accordance with an embodiment of the present application.

FIG. 2B illustrates an exemplary battery cabinet corresponding to FIG. 2A, in accordance with an embodiment of the present application.

In the figures, like reference numerals refer to the same figure elements.

DETAILED DESCRIPTION

Figure 1:
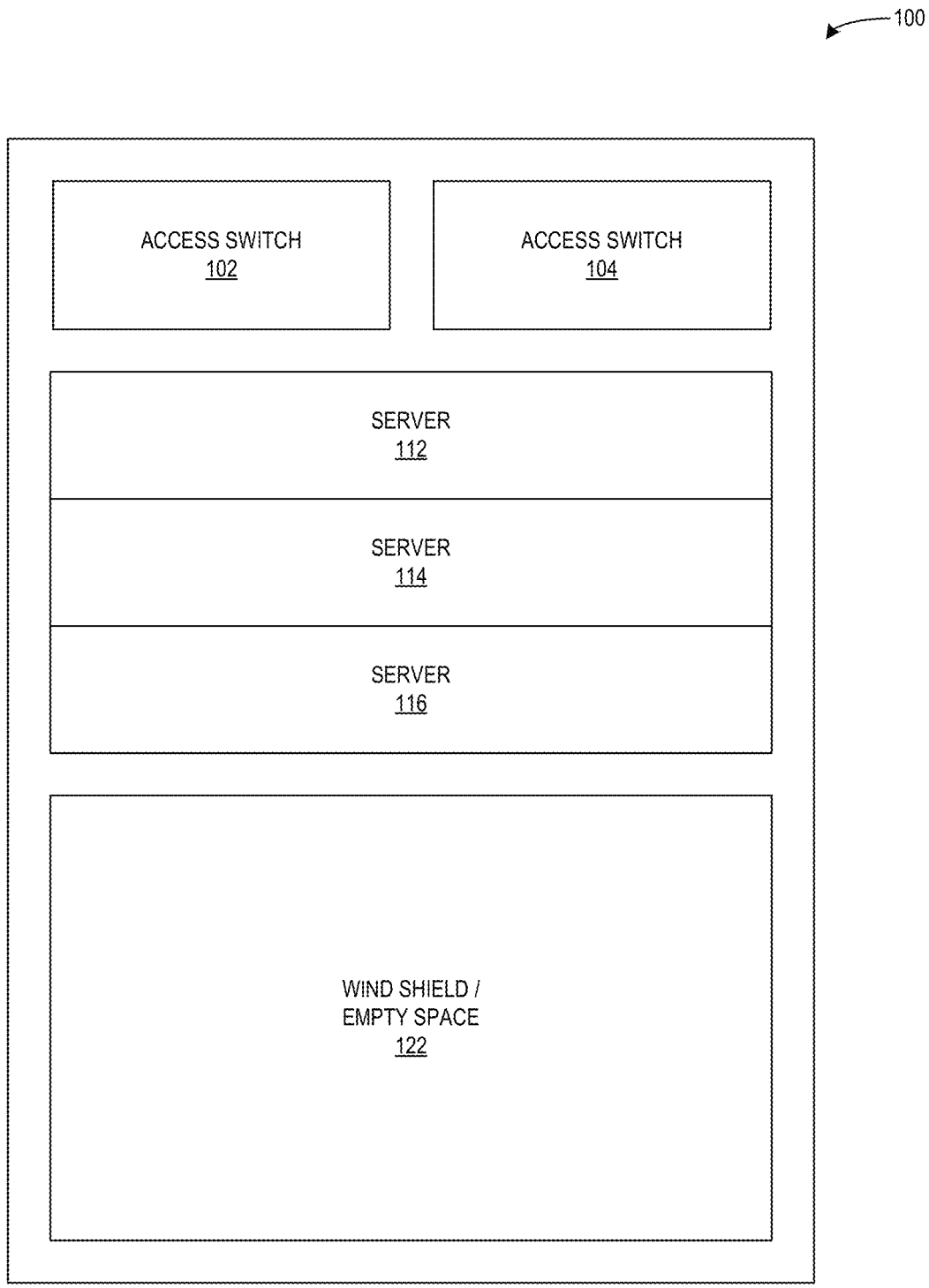
FIG. 1 illustrates an exemplary server cabinet, in accordance with the prior art.

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the embodiments described herein are not limited to the embodiments shown, but are to be accorded the widest scope consistent with the principles and features disclosed herein.

Overview

The embodiments described herein facilitate an improved deployment density of servers (e.g., in a data center) by providing a battery cabinet co-located with associated server cabinets (e.g., in a data center pod).

As described above, the equipment deployed in a data center continues to consume an increasing amount of power. A data center cabinet can include multiple computing devices, such as servers, switches, and hard disks. Some application scenarios may result in high peak power consumption for a short period of time by the computing devices in the cabinet. The power consumed during such peak periods may not match the power allocated or budgeted to the cabinet. This can result in a power reset or a blow-out, which can significantly affect the reliability of the infrastructure, including the overall reliability of a data center.

Current approaches to addresses these challenges involve deploying equipment in data center cabinets while seeking to maintain a margin which allows the power budget to tolerate the peak power caused by certain application scenarios. However, as the power consumption of a single server continues to increase, fewer servers can be deployed for service using the current method of maintaining the margin. This can result in a low efficiency of cabinet utilization, as described below in relation to FIG. 1. Furthermore, in current power deployment methods, the average power budget per cabinet may be significantly greater than what is actually needed by a single cabinet. Thus, the over-budgeted power can result in a waste of the power supply, and the low-efficiency cabinet utilization can lead to a high total cost of operation (TCO).

The embodiments described herein address these challenges by providing a battery cabinet co-located with server cabinets in a data center pod. The battery cabinet can both improve the power utilization efficiency and decrease the TCO. The battery cabinet can include sealed batteries, a power outlet, and a power management module, as described below in relation to FIGS. 2B and 2C. The power management module can include a power monitoring module, a detection module, and a power provision module. The power monitoring module is configured to monitor a first amount of power consumed by one or more computing devices via a main power supply. The detection module is configured to detect that the first amount of power consumption exceeds a predetermined power consumption threshold. The power provision module is configured to provide, via the sealed batteries, power to the power outlet until the first amount of power consumption no longer exceeds the predetermined power consumption threshold.

Thus, by placing the battery cabinet in the same pod as the server cabinets (where a server cabinet can include a plurality of various computing devices), the embodiments described herein provide a system which reshapes the power budget of a respective server cabinet of the pod to enable an improved deployment density of servers.

A "storage server" refers to a computing device which can include multiple storage drives. A distributed storage system can include multiple storage servers. A "storage drive" refers to a device or a drive with a non-volatile memory which can provide persistent storage of data, e.g., a solid state drive (SSD) or a hard disk drive (HDD).

A "battery cabinet" refers to a physical unit which includes: sealed batteries; a power outlet; and a power management module, as described herein.

A "server cabinet" refers to a physical unit which includes one or more computing devices. In some embodiments, a server cabinet can refer to a logical unit associated with one or more computing devices.

A "pod" refers to a group of computing devices (such as network, compute, storage, and application components) that can work together to deliver networking/storage services. A pod can reside in a data center, and can include a battery cabinet and a plurality of server cabinets.

The "power consumed by a server cabinet" refers to the power consumed by one or more computing devices of the server cabinet. Similarly, the "allocated power budget for a server cabinet" refers to the amount of power allocated or budgeted to one or more computing devices of the server cabinet.

Exemplary Server Cabinet in the Prior Art

FIG. 1 illustrates an exemplary server cabinet 100, in accordance with the prior art. As described above, the current deployment of equipment in a data center cabinet (such as server cabinet 100) can result in a low-efficiency cabinet utilization due to attempts to achieve the goal of maintaining a margin which allows the power budget to tolerate the peak power caused by certain application scenarios. However, as the power consumption of a single server continues to increase, fewer servers can be deployed for service using the current method of maintaining the margin. This can result in a low efficiency of cabinet utilization. For example, server cabinet 100 can include: two access switches 102 and 104; servers 112, 114, and 116; and a large amount of empty space 122, which can be used as a wind shield to ensure isolation between a cold aisle and a hot aisle in the data center. That is, wind shield 122 can effectuate the flow of cold air through server cabinet 100 to sufficiently cool down or negate any temperature changes due to the energy consumed by servers 112-116.

Furthermore, server cabinet 100 depicts the low-utilization of the cabinet. As the power consumption of each single server continues to increase, current systems may need to allocate an average power budget per cabinet that is significantly greater than what is actually needed by a single cabinet. This can result in a waste of power supply. Moreover, the system cannot maintain the necessary margin for allowing the allocated power to tolerate peak power and also increase the number of servers in the cabinet. As depicted in server cabinet 100, only three servers may reside in the cabinet. This low utilization can lead to a decreased TCO, especially in light of the increasing amount of network data/traffic in today's data centers and the ability to handle growth by scaling up.

Exemplary Pod or Group of Computing Devices in a Data Center

FIG. 2A illustrates an exemplary pod (or group) 200 of computing devices in a data center, including a battery cabinet which provides additional power to co-located server cabinets, in accordance with an embodiment of the present application. Pod 200 can include: a hot aisle 202; a first row of cabinets, including a battery cabinet 210 and associated server cabinets 212, 214, 216, and 218; a cold aisle 204; a second row of cabinets, including a battery cabinet 220 and associated server cabinets 222, 224, 226, and 228; a hot aisle 206; and a gate 208. Server cabinets 212-218 can be associated with battery cabinet 210, and server cabinets 222-228 can be associated with battery cabinet 220.

The battery cabinet in each row can detect when the power consumed by an associated server cabinet (or group of server cabinets) exceeds the allocated power budget for the server cabinet (or group of server cabinets). The battery cabinet can then supply the necessary power required by the associated server cabinet (or group of server cabinets) until the consumed power no longer exceeds the allocated power budget. For example, battery 210 can detect when the power consumed by associated server cabinet 212 (or any or all of server cabinets 212-218) exceeds a predetermined power consumption threshold (i.e., an amount of power allocated or budgeted to server cabinet 212 (or any or all of cabinets of 212-218). Subsequently, battery cabinet 212 can provide power to associated server cabinet 212 (or any or all of cabinets 212-218) until the power consumed no longer exceeds the predetermined power consumption threshold. Exemplary battery cabinets and their constituent modules for performing these operations are described below in relation to FIGS. 2B and 2C.

Exemplary Battery Cabinets

FIG. 2B illustrates an exemplary battery cabinet 230 corresponding to FIG. 2A, in accordance with an embodiment of the present application. Battery cabinet 230 can correspond to, e.g., battery cabinet 210 or battery cabinet 220 of FIG. 2A. Battery cabinet 230 can include: a plurality of fans 232, 234, 236, 238, 240, and 242; an electrical distribution module 244; a management and monitoring module 246; a modular uninterruptible power supply (UPS) 248; and a plurality of sealed batteries 252, 254, 256, and 258.

Electrical distribution module 244 can be configured to provide power to one or more computing devices of a server cabinet(s). Management and monitoring module 246 can be configured to monitor a first amount of power consumed by the one or more computing devices of the server cabinet(s), and can be further configured to detect when that monitored first amount of power exceeds a predetermined power consumption threshold (i.e., an amount of power budgeted to the server cabinet(s)). Management and monitoring module 246 can also be configured to monitor the status or health condition of sealed batteries 252-258, as each sealed battery can be pluggable for efficient replacement and migration. Modular UPS 248 can be configured to draw power from sealed batteries 252-258 and provide the drawn power to the one or more computing devices of the server cabinet(s). An exemplary assembly for a sealed battery is described below in relation to FIG. 3.

Figure 2C:
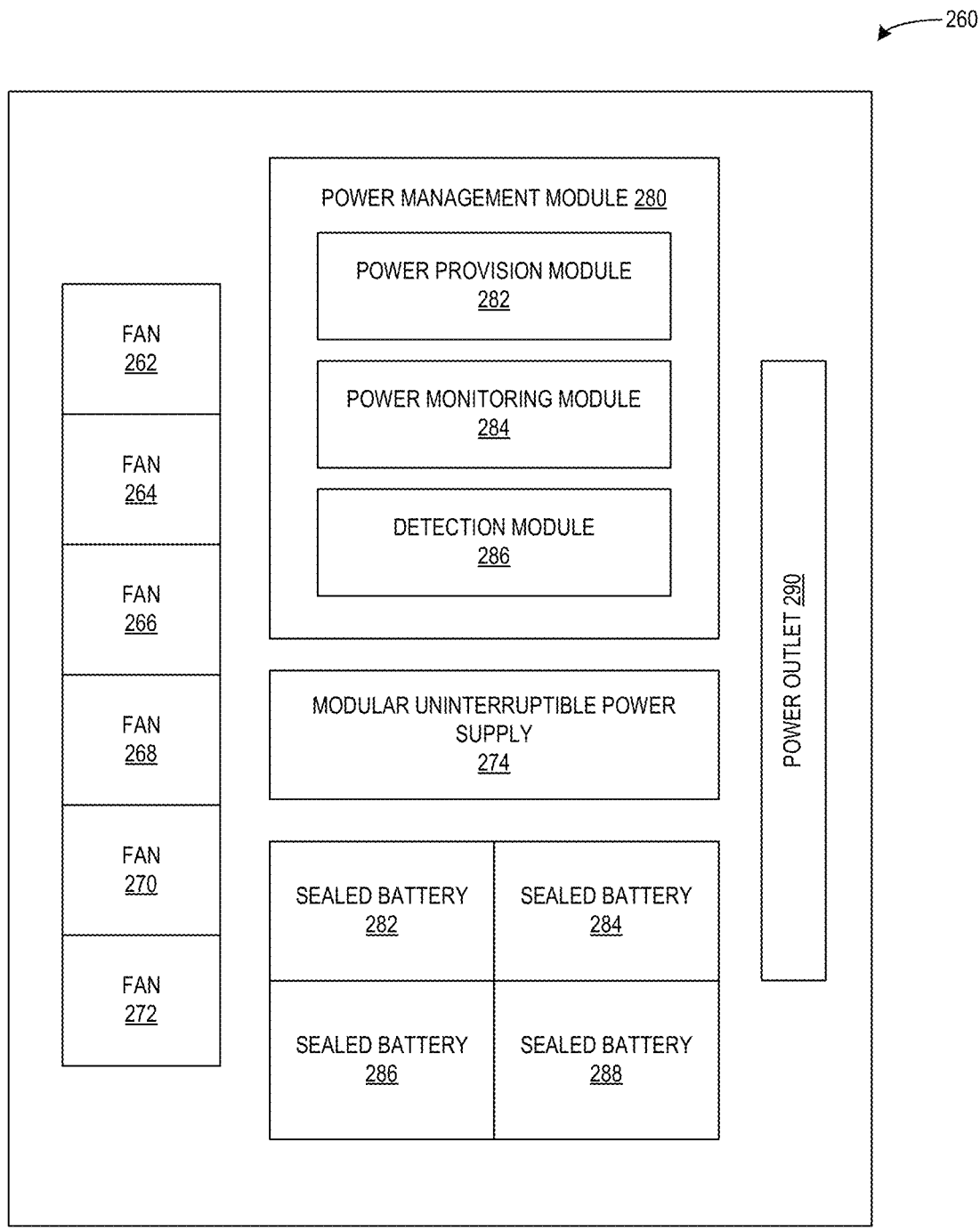
FIG. 2C illustrates an exemplary battery cabinet corresponding to FIG. 2A, in accordance with an embodiment of the present application.

FIG. 2C illustrates an exemplary battery cabinet 260 corresponding to FIG. 2A, in accordance with an embodiment of the present application. Battery cabinet 260 can correspond to, e.g., battery cabinet 210 or battery cabinet 220 of FIG. 2A. Battery cabinet 260 can include: a plurality of fans 262, 264, 266, and 268; a power management module 280; a modular UPS 274; a plurality of sealed batteries 282, 284, 286, and 288; and a power outlet 290.

Power management module 280 can include: a power provision module 282; a power monitoring module 284; and a detection module 286. Power monitoring module 284 can be configured to monitor a first amount of power consumed by one or more computing devices via a main supply (not shown). Detection module 286 can be configured to detect that the first amount of power consumption exceeds a predetermined power consumption threshold. Power provision module 282 can be configured to provide, via the sealed batteries, power to power outlet 290 until the first amount of power consumption no longer exceeds the predetermined power consumption threshold. Modular UPS 274 can be coupled to power management module 280 and configured to draw power from sealed batteries 282-288 and provide the drawn power via power outlet 290 to one or more computing devices of the associated server cabinet(s).

Power provision module 282 can correspond to electrical distribution module 244 of FIG. 2B. Power monitoring module 284 and detection module 286 can correspond to management and monitoring module 246 of FIG. 2B. Power outlet 290 can be coupled in a manner which provides power to an associated server cabinet(s), such as server cabinet 212 (or any or all of server cabinets 212-218) of FIG. 2A.

Exemplary Sealed Batteries: Assembly and Battery Strings

Figure 3:
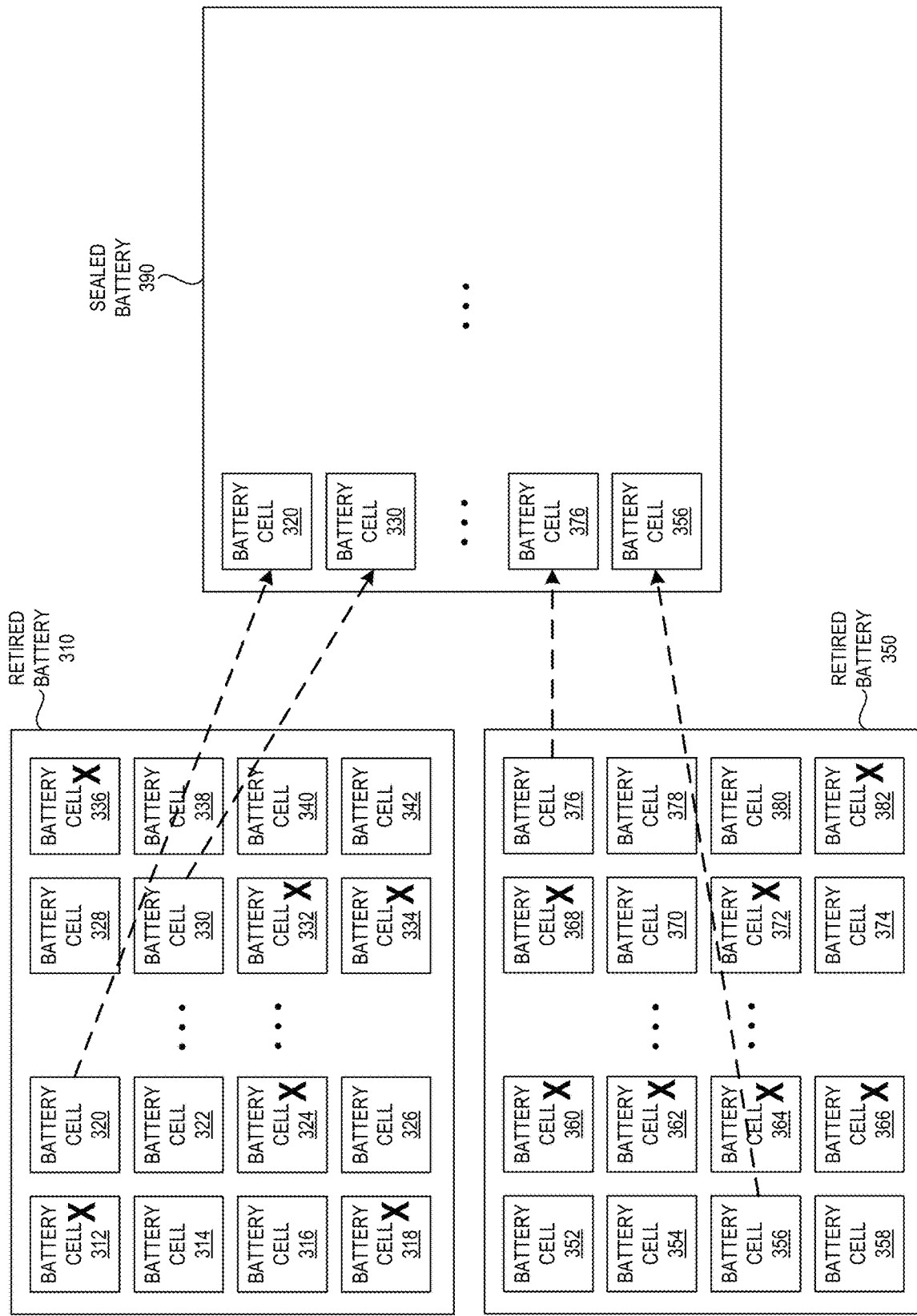
FIG. 3 illustrates an assembly of an exemplary sealed battery, in accordance with an embodiment of the present application.

FIG. 3 illustrates an assembly of an exemplary sealed battery 390, in accordance with an embodiment of the present application. In the embodiments described herein, the system can use functioning battery cells from retired batteries to assemble sealed battery 390. Retired batteries are batteries previously used in, e.g., an industrial context, an electric vehicle, a hybrid vehicle, and any manner which leaves some non-functioning battery cells and at least one functioning battery cell in the retired battery. In some industries, a battery that no longer satisfies a strict requirement for a specific industry (such as the automobile industry, which can require a high safety margin for batteries used in operating moving vehicles) may be retired and replaced by a new battery. Such as battery can be referred to as a "retired battery." However, a retired battery may include some non-functioning battery cells and some functioning battery cells. A worker in a facility can open a retired battery, test the battery cells of the retired battery to identify functioning and non-functioning battery cells, sort out the functioning battery cells, and assemble a sealed battery by removing the functioning battery cells from the retired battery and placing the functioning battery cells into the sealed battery.

In assembling sealed battery 390, the functioning battery cells of retired battery 310 and retired battery 350 can be removed from the respective retired batteries and placed into sealed battery 390. In retired batteries 310 and 350, non-functioning battery cells are denoted with a bold "X" (e.g., battery cells 312, 318, 324, etc.) while functioning battery cells do not have any special marking. For example, functioning battery cells 320 and 330 of retired battery 310 can be removed from retired battery 310 and placed into sealed battery 390. Similarly, functioning battery cells 356 and 376 can be removed from retired battery 350 and placed into sealed battery 390.

Figure 4:
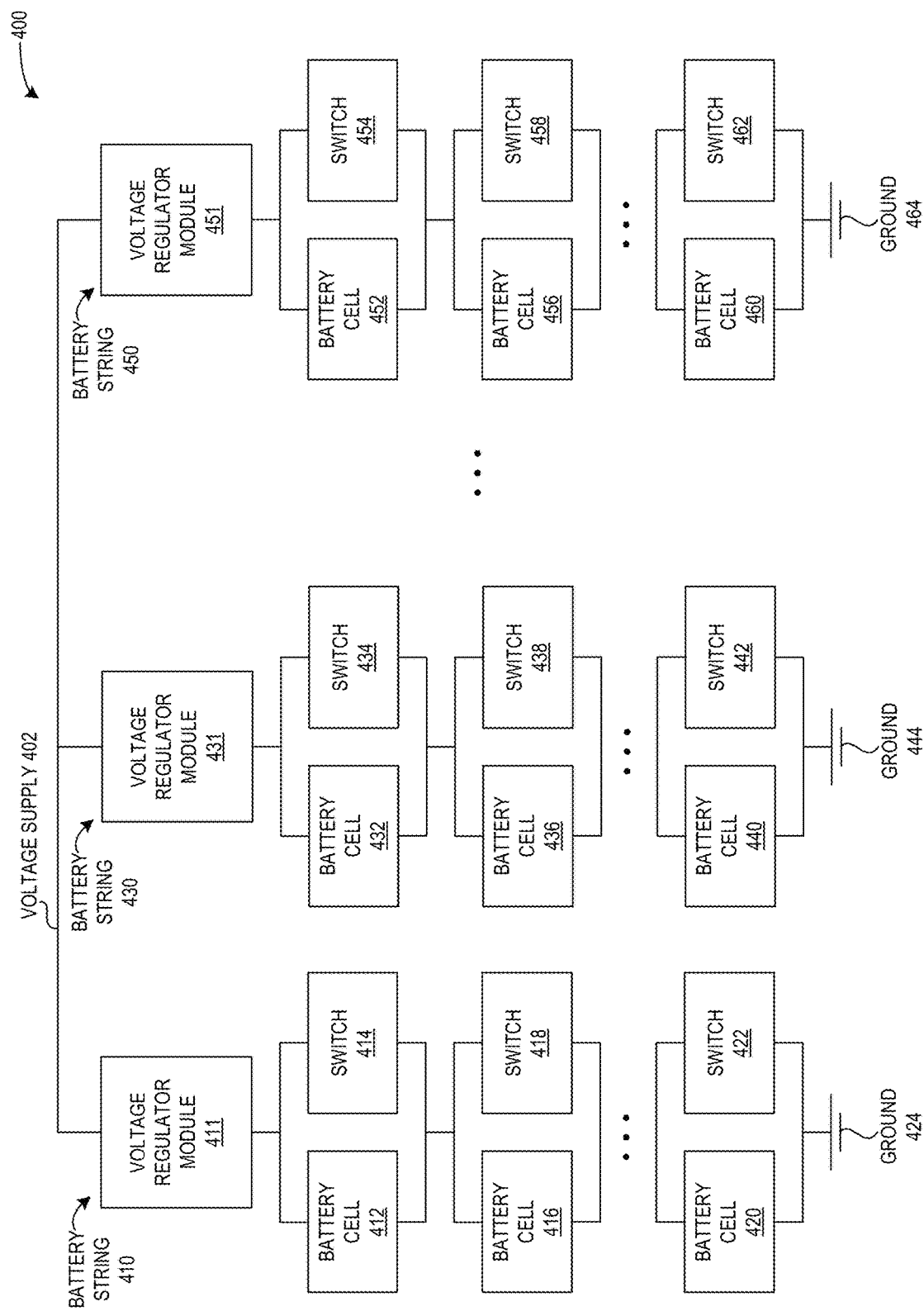
FIG. 4 illustrates an internal architecture for an exemplary sealed battery, in accordance with an embodiment of the present application.

FIG. 4 illustrates an exemplary internal architecture 400 for a sealed battery (such as sealed battery 390 of FIG. 3), in accordance with an embodiment of the present application. Sealed battery 390 can maintain its capacity through a plurality of parallel battery strings. Each battery string can include a voltage regulator module and pairs of battery cells and corresponding switches. The voltage regulator module is configured to stabilize the output voltage from the battery cells with a controlled vibration. The pairs can be coupled to the ground. In order to prevent accidents which can be caused by the failure of a battery cell, the system can use the switch in each pair of a switch and a battery cell. That is, within a respective pair comprising a first battery cell and a corresponding first switch, the first switch is configured to bypass the first battery cell in response to a failure of the first battery cell. This allows the entire sealed battery to continue providing a consistent power supply with a stable voltage to the associated server cabinet(s) (e.g., the server cabinets in a same pod as the battery cabinet).

In FIG. 4, architecture 400 of sealed battery 390 can include a plurality of battery strings 410, 430, and 450. Battery string 410 can include: a voltage regulator module 411; a pair including a battery cell 412 and a corresponding switch 414; a pair including a battery cell 416 and a corresponding switch 418; a pair including a battery cell 420 and a switch 422; and a ground 424. Similar, battery string 430 can include: a voltage regulator module 431; a pair including a battery cell 432 and a corresponding switch 434; a pair including a battery cell 436 and a corresponding switch 438; a pair including a battery cell 440 and a switch 442; and a ground 444. In addition, battery string 450 can include: a voltage regulator module 451; a pair including a battery cell 452 and a corresponding switch 454; a pair including a battery cell 456 and a corresponding switch 458; a pair including a battery cell 460 and a switch 462; and a ground 464. As an example, switch 418 can be configured to bypass corresponding battery cell 416 in response to a failure of battery cell 416.

Exemplary Charging and Discharging of Sealed Batteries in Battery Cabinet

Figure 5:
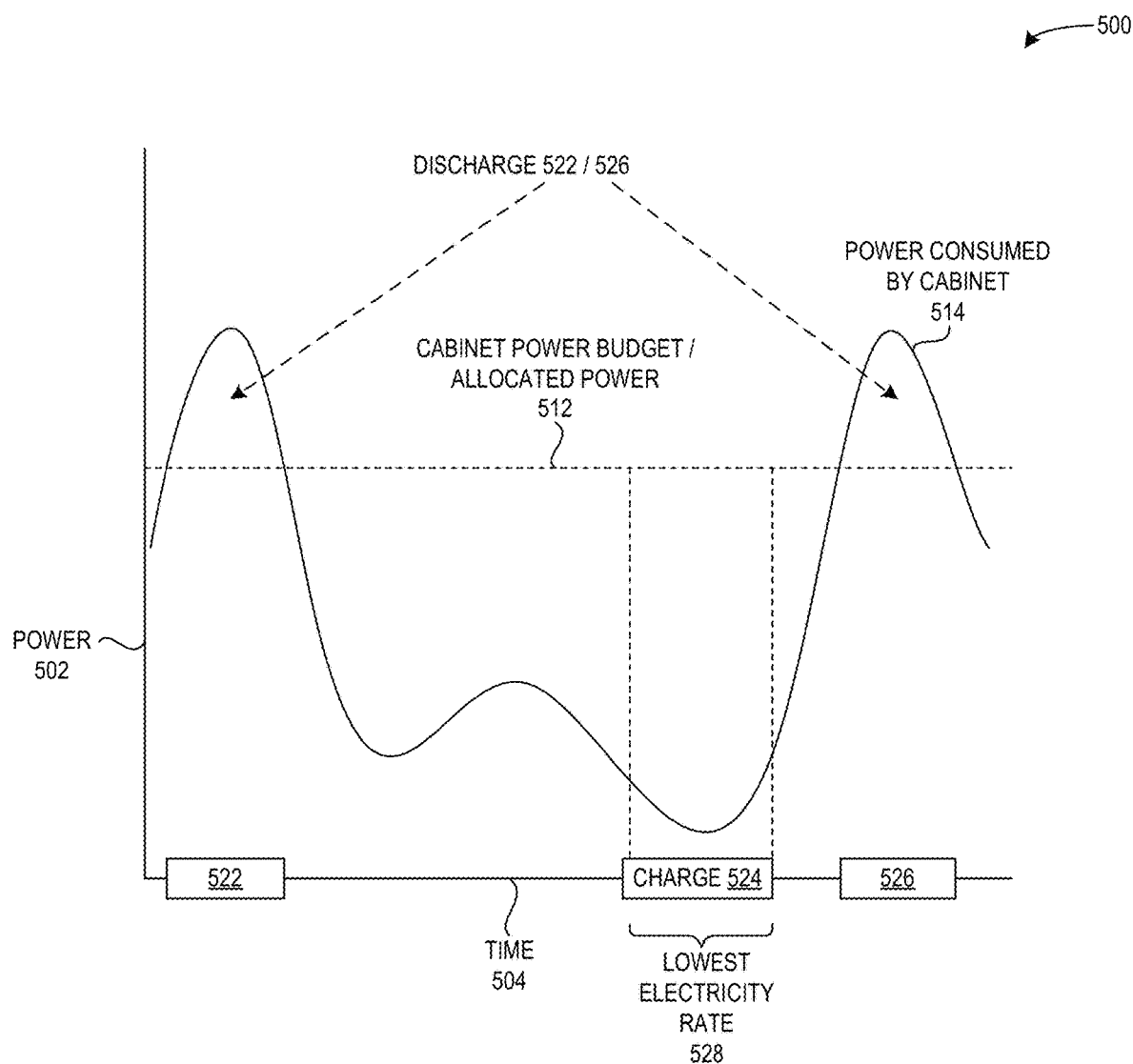
FIG. 5 illustrates a diagram depicting the charging and discharging of the sealed batteries in a battery cabinet, in accordance with an embodiment of the present application.

FIG. 5 illustrates a diagram 500 depicting the charging and discharging of the sealed batteries in a battery cabinet, in accordance with an embodiment of the present application. In diagram 500, the x-axis indicates a time 504 and the y-axis indicates a power 502 (e.g., the power consumed by the computing devices of a particular cabinet(s) at a given time). The amount of power allocated or budgeted to the cabinet is indicated by the horizontal dashed line (cabinet power budget/allocated power 512, also referred to as a "predetermined power consumption threshold"). The amount of power consumed by the cabinet is indicated by the curving line (power consumed by cabinet 514, also referred to as "power consumption").

In the embodiments described herein, the system can monitor the power consumption, and detect when the power consumption exceeds the predetermined power consumption threshold. The system can then provide, via the sealed batteries, power to the cabinet (via, e.g., power outlet 290 of battery cabinet 260 of FIG. 2C), until the power consumption no longer exceeds the predetermined power consumption threshold. This power provision is indicated in two areas in diagram 500: a discharge 522 (also indicated on the x-axis for time 504 as 522); and a discharge 526 (also indicated on the x-axis for time 504 as 526). This allows the cabinets to continue normal operation during peak power usage times 522 and 526 by using the additional power supplied by the associated battery cabinet.

In addition to providing power or charge to the computing devices of the associated cabinet server(s) during peak power usage times 522 and 526, the system can also determine a period of low power consumption and charge the sealed batteries by pulling power from a main power supply (indicated on the x-axis for time as a charge 524). The period of low power consumption can be predetermined and can correspond to, e.g., a time period with a lowest electricity rate 528, or a time period with an electricity rate which is on the lower range (or a predetermined lower range) of rates charged for using power from the national grid.

Furthermore, in addition to pulling from the main power supply to recharge the sealed batteries, the system can also or alternatively pull power from a renewable power supply, such as: wind power; rainfall power; water-related power; solar energy; and tidal power. One advantage to using renewable energy is the low cost, in comparison to using power from the national grid. However, because the quality of renewable energy is not stable (e.g., wind and tidal power cannot be accurately predicted or consistent), renewable energy may not meet the strict requirements for acceptance of usage on the national grid. For example, wind and tidal power cannot be sent through long distances for a broad range of users. A data center which consumes a large amount of power and is located close to a renewable energy plant (such as a wind or tidal power plant) can provide a practical means to efficiently utilize the renewable energy. Thus, the renewable power supply can be generated from a source which is located within a predetermined distance from the battery cabinet. A close proximity may allow clean energy (such as wind and tide) to provide additional cooling effects for a reduced power usage effectiveness (PUE).

Either the power plant or the data center can be built first. The closely located power plant can supply either or both the main supply and the renewable energy. The system can use a predetermined ratio of these two types of energy to charge the sealed batteries. The ratio can be further based on one or more of: a currently monitored amount of power consumption; a currently available amount of renewable energy; an amount of renewable energy predicted to be produced or stored, based on weather, climate, geological reports, etc.

Renewable Energy Sources

Figure 6:
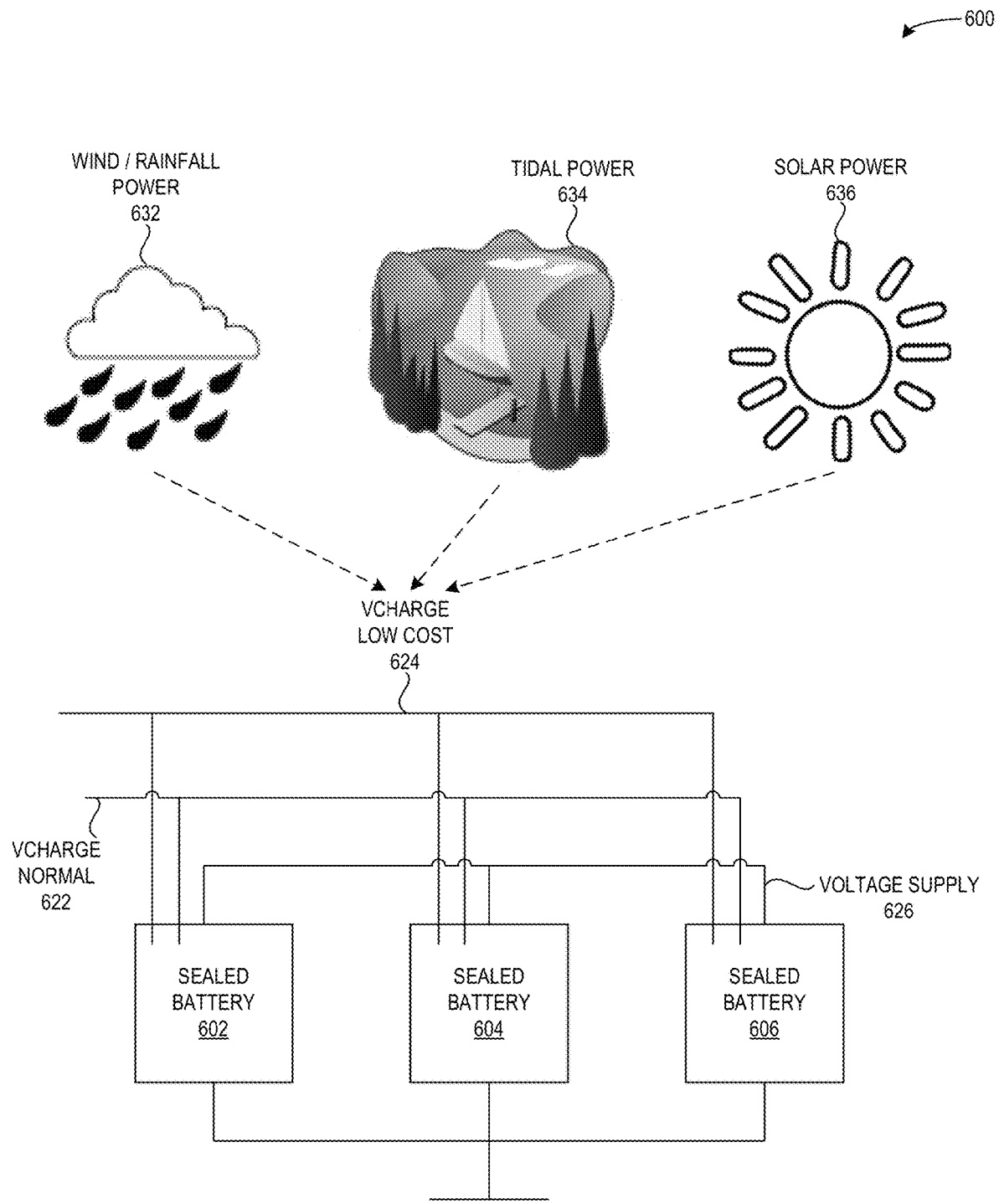
FIG. 6 illustrates exemplary low-cost charging from renewable energy sources, in accordance with an embodiment of the present application.

FIG. 6 illustrates exemplary low-cost charging 600 from renewable energy sources, in accordance with an embodiment of the present application. Charging 600 depicts a vcharge low cost 624 and a vcharge normal 622, both of which can provide power to sealed batteries 602, 604, and 606. Vcharge low cost 624 can include several renewable energy sources: a wind/rainfall power 632; a tidal power 634; and a solar power 636. Vcharge normal 622 can be provided via a main power supply, such as from a national grid (not shown). In addition, sealed batteries 602-606 can provide power to computing devices of an associated cabinet(s) via a voltage supply 626.

Thus, by using both vcharge low cost 624 (from the renewable energy sources) and vcharge normal 622 (from a main power supply), the embodiments described herein can save a significant amount in terms of cost, in comparison to using only the electric power rate charged for energy pulled only from the national grid (i.e., vcharge normal 622).

Exemplary Method for Reshaping Power Budget of a Server Cabinet

Figure 7A:
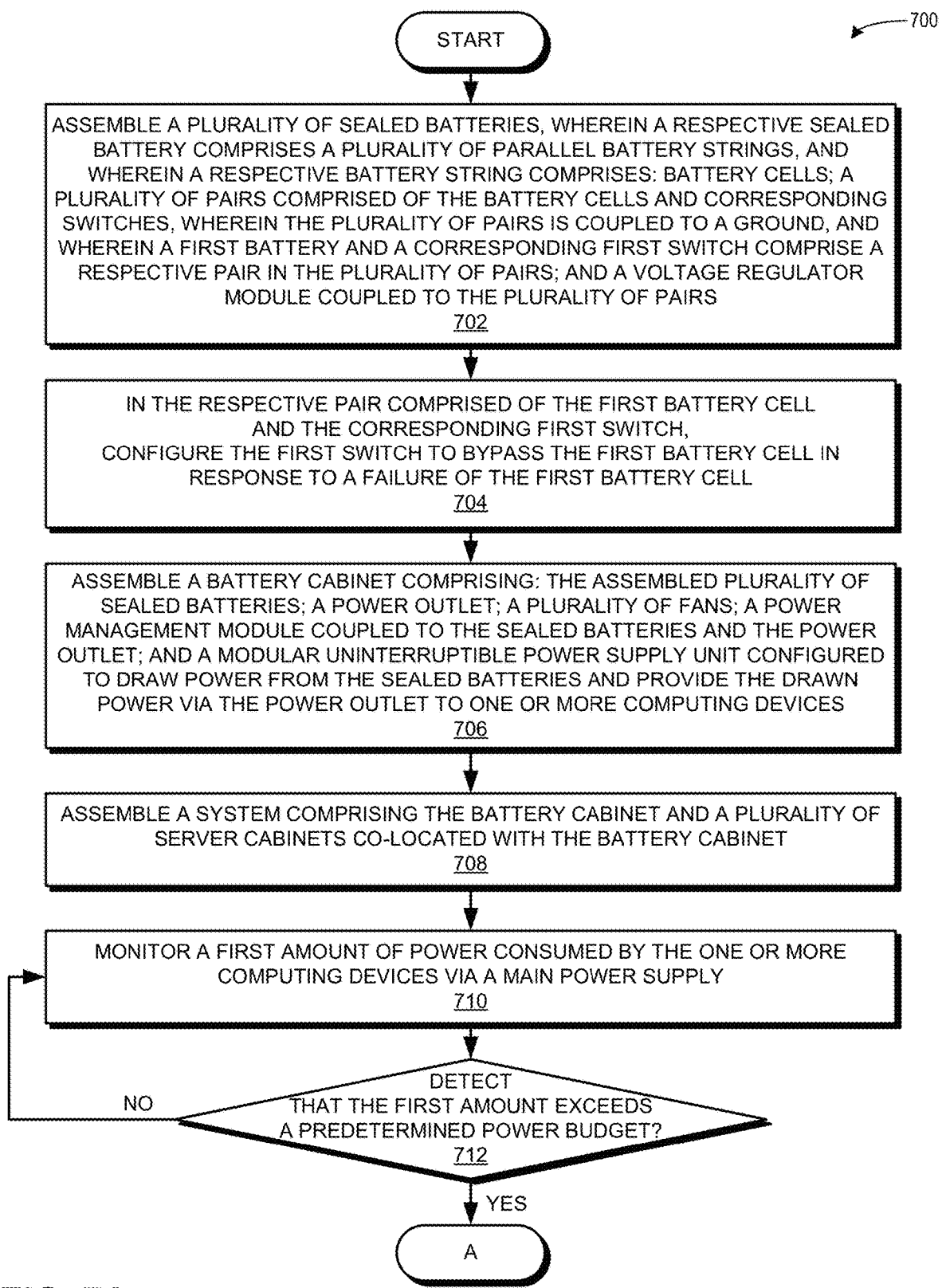
FIG. 7A presents a flowchart illustrating a method for reshaping the power budget of a server cabinet to facilitate an improved deployment density of servers, in accordance with an embodiment of the present application.

FIG. 7A presents a flowchart 700 illustrating a method for reshaping the power budget of a server cabinet to facilitate an improved deployment density of servers, in accordance with an embodiment of the present application. During operation, the system (or a human user of the system) assembles a plurality of sealed batteries, wherein a respective sealed battery comprises a plurality of parallel battery strings, and wherein a respective battery string comprises: battery cells; a plurality of pairs comprised of the battery cells and corresponding switches, wherein the plurality of pairs is coupled to a ground, and wherein a first battery cell and a corresponding first switch comprise a respective pair in the plurality of pairs; and a voltage regulator module coupled to the plurality of pairs (operation 702). In the respective sealed battery, the battery cells comprise functioning battery cells from retired batteries, and a respective retired battery is previously used in one or more of: an industrial context; an electric vehicle; a hybrid vehicle; and a manner which leaves some non-functioning battery cells and at least one functioning battery cell in the respective retired battery, as described above in relation to FIG. 3.

In the respective pair comprised of the first battery cell and the corresponding first switch, the system configures the first switch to bypass the first battery cell in response to a failure of the first battery cell (operation 704). The system assembles a battery cabinet, which comprises: the assembled plurality of sealed batteries; a power outlet; a plurality of fans; a power management module coupled to the sealed batteries and the power outlet; and a modular uninterruptible power supply unit configured to draw power from the sealed batteries and provide the drawn power via the power outlet to one or more computing devices (operation 706). The system couples the power management module to the sealed batteries and the power outlet, and also couples the power outlet to the one or more computing devices (not shown).

The system assembles a system comprising the battery cabinet and a plurality of server cabinets co-located with the battery cabinet (operation 708). The battery cabinet can be associated with the computing devices of the co-located server cabinets, e.g., as part of a single data center pod. The computing devices can be located in the plurality of server cabinets.

The system monitors a first amount of power consumed by the one or more computing devices via a main power supply (operation 710). If the system detects that the first amount of power consumption does not exceed a predetermined power budget for the cabinet (decision 712), the operation returns to operation 710. The predetermined power budget is the amount of power allocated to or budgeted to the computing devices of a server cabinet (or group of server cabinets) associated with a battery cabinet. The predetermined power budget can also be referred to as the "predetermined power consumption threshold." If the system detects that the first amount of power consumption exceeds the predetermined power budget for the cabinet (decision 712), the operation continues at Label A of FIG. 7B.

Figure 7B:
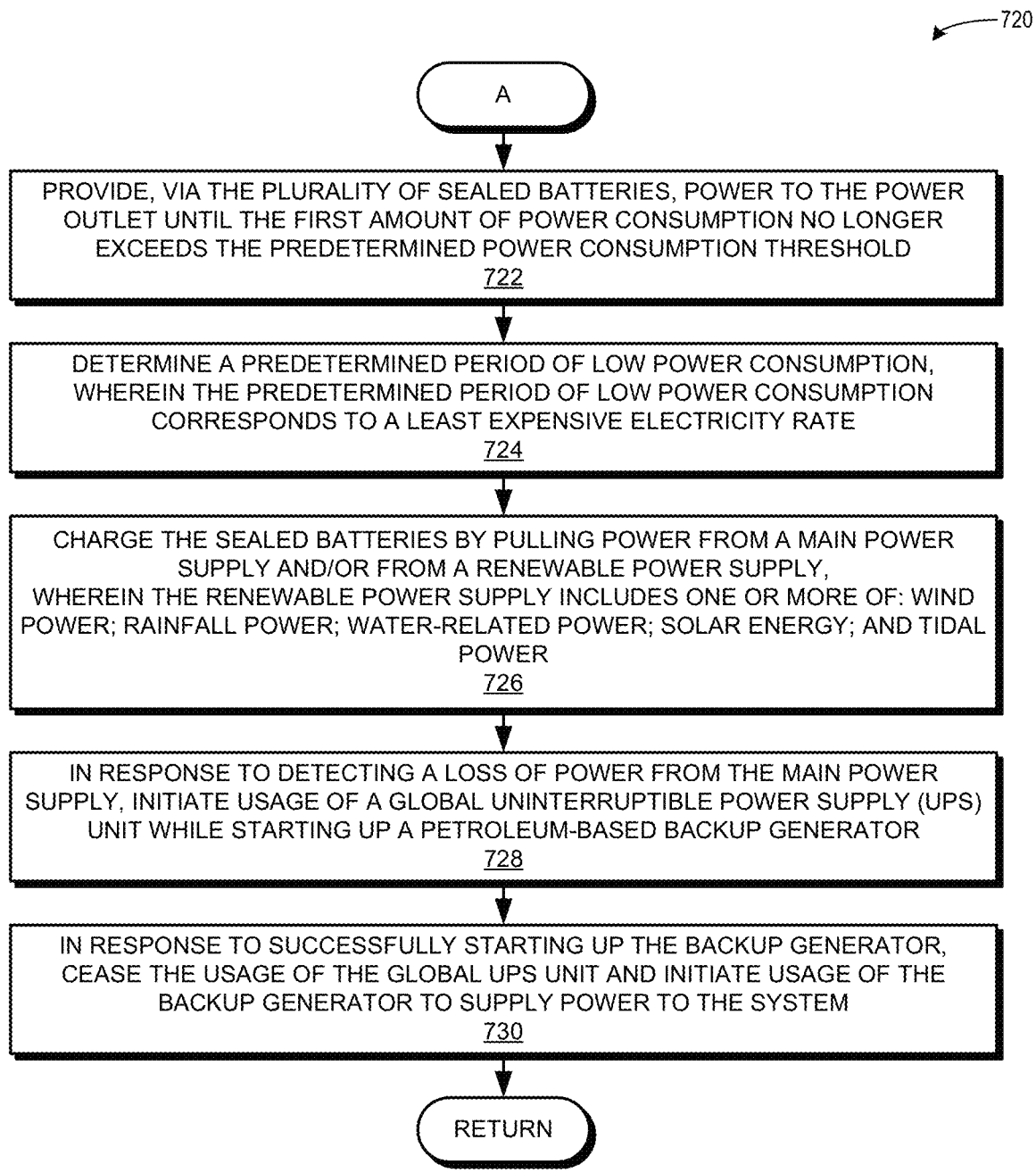
FIG. 7B presents a flowchart illustrating a method for reshaping the power budget of a server cabinet to facilitate an improved deployment density of servers, including charging and discharging by the battery cabinet, in accordance with an embodiment of the present application.

FIG. 7B presents a flowchart 720 illustrating a method for reshaping the power budget of a server cabinet to facilitate an improved deployment density of servers, including charging and discharging by the battery cabinet, in accordance with an embodiment of the present application. During operation, the system provides, via the plurality of sealed batteries, power to the power outlet until the first amount of power consumption no longer exceeds the predetermined power consumption threshold (operation 722). The system determines a predetermined period of low power consumption, wherein the predetermined period of low power consumption corresponds to a least expensive electricity rate (operation 724). The system charges the sealed batteries by pulling power from a main power supply and/or from a renewable power supply, wherein the renewable power supply includes one or more of: wind power; rainfall power; water-related power; solar energy; and tidal power (operation 726). As described above in relation to FIGS. 5 and 6, the renewable power supply can be generated from a source which is located within a (close) predetermined distance from the battery cabinet, associated server cabinet(s), pod, or data center.

In response to detecting a loss of power from the main power supply, the system initiates usage of a global uninterruptible power supply (UPS) unit while starting up a petroleum-based backup generator (operation 728). In response to successfully starting up the backup generator, the system ceases the usage of the global UPS unit and initiates usage of the backup generator to supply the main power to the system (operation 730).

Exemplary Computer System

Figure 8:
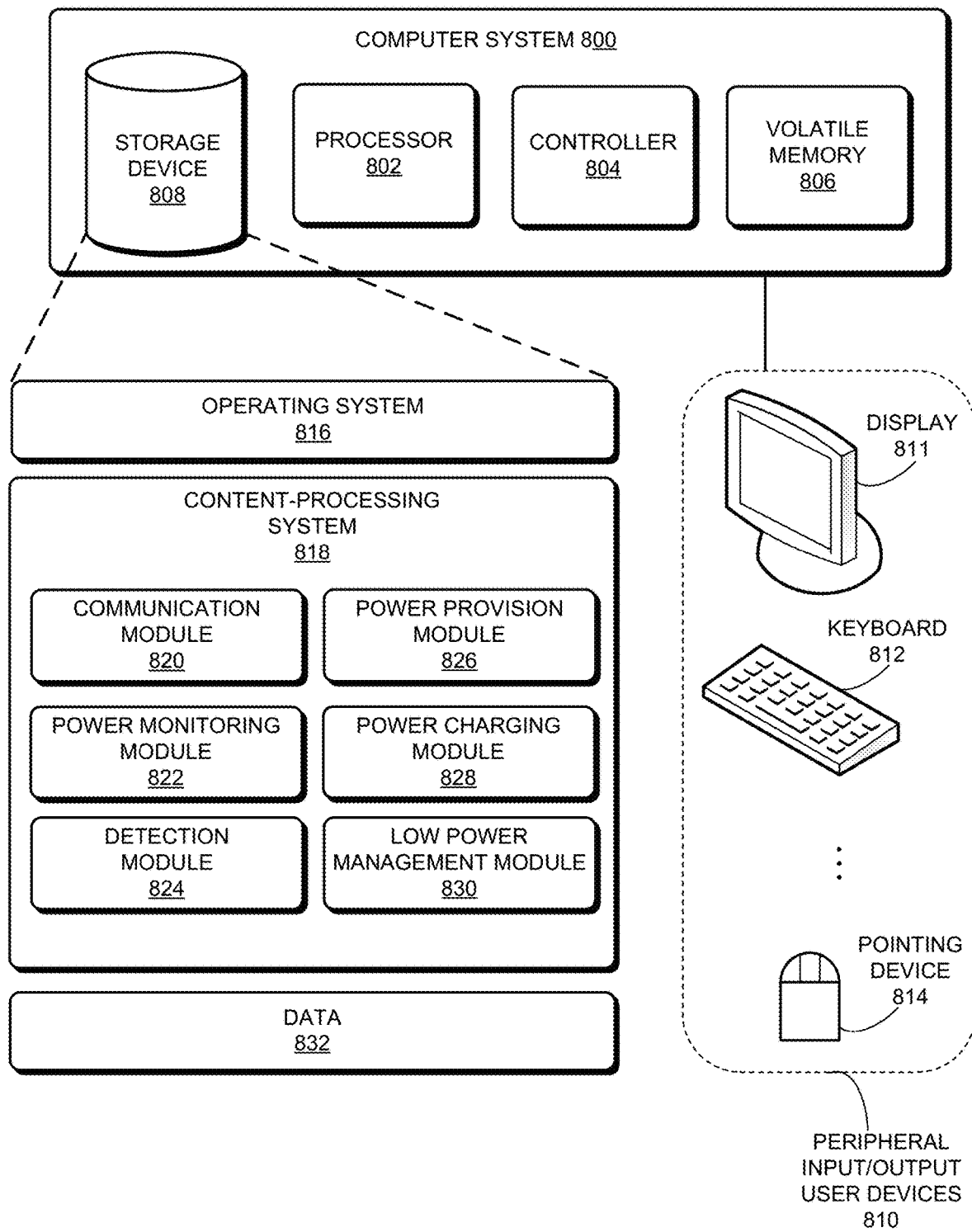
FIG. 8 illustrates an exemplary computer system that facilitates reshaping the power budget of a server cabinet to facilitate an improved deployment density of servers and storage device that facilitates data placement, in accordance with an embodiment of the present application.

FIG. 8 illustrates an exemplary computer system 800 that facilitates reshaping the power budget of a server cabinet to facilitate an improved deployment density of servers, in accordance with an embodiment of the present application. Computer system 800 includes a processor 802, a controller 804, a volatile memory 806, and a storage device 808. Volatile memory 806 can include, e.g., random access memory (RAM), that serves as a managed memory, and can be used to store one or more memory pools. Storage device 808 can include persistent storage which can be managed or accessed via processor 802 or controller 804. Furthermore, computer system 800 can be coupled to peripheral input/output (I/O) user devices 810, e.g., a display device 811, a keyboard 812, and a pointing device 814. Storage device 808 can store an operating system 816, a content-processing system 818, and data 832.

Content-processing system 818 can include instructions, which when executed by computer system 800, can cause computer system 800 to perform methods and/or processes described in this disclosure. Specifically, content-processing system 818 can include instructions for receiving and transmitting data packets, including data to be read or written, an input/output (I/O) request (e.g., a read request or a write request), and data associated with an I/O request (communication module 820).

Content-processing system 818 can include instructions for monitoring a first amount of power consumed by one or more computing devices via a main power supply (power monitoring module 822). Content-processing system 818 can include instructions for detecting that the first amount of power consumption exceeds a predetermined power consumption threshold (detection module 824). Content-processing system 818 can include instructions for providing, via a plurality of sealed batteries, power to a power outlet until the first amount of power consumption no longer exceeds the predetermined power consumption threshold (power provision module 826).

Content-processing system 818 can include instructions for, in response to determining a predetermined period of low power consumption (low power management module 830), charging the sealed batteries by pulling power from the main power supply and/or a renewable power supply (power charging module 828).

Data 832 can include any data that is required as input or generated as output by the methods and/or processes described in this disclosure. Specifically, data 832 can store at least: data; a request; a read request; a write request; an input/output (I/O) request; data associated with a read request, a write request, or an I/O request; an amount of power consumed by one or more computing devices; a predetermined power consumption threshold; an allocated power budget for a cabinet(s); an indicator of a pod or group of cabinets, including a battery cabinet and one or more server cabinets with one or more computing devices; an indicator of a power outlet, a fan, or a sealed battery; an indicator of a battery string, a voltage regulator module, and a pair of a battery cell and a corresponding switch; an indicator of a failure of a battery cell; an indicator of whether or not a battery cell from a retired battery is functioning; an indicator of a main power supply or a renewable power supply; a type of renewable power supply; a ratio of main power to renewable power to be used; a time period; an electricity rate; a least expensive electricity rate; an indicator of a period of charging or discharging for a sealed battery; a period of discharge; a peak period; and a period of highest power consumption which exceeds the predetermined power consumption threshold.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described above can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

The foregoing embodiments described herein have been presented for purposes of illustration and description only. They are not intended to be exhaustive or to limit the embodiments described herein to the forms disclosed. Accordingly, many modifications and variations will be apparent to practitioners skilled in the art. Additionally, the above disclosure is not intended to limit the embodiments described herein. The scope of the embodiments described herein is defined by the appended claims.

What is claimed is:

1. A battery cabinet, comprising:
   a plurality of sealed batteries;
   a power outlet; and
   a power management module coupled to the sealed batteries and the power outlet, the power management module comprising:
      a power monitoring module configured to monitor a first amount of power consumed by one or more computing devices via a main power supply;
      a detection module configured to detect that the first amount of power consumption exceeds a predetermined power consumption threshold; and
      a power provision module configured to provide, via the sealed batteries, power to the power outlet until the first amount of power consumption no longer exceeds the predetermined power consumption threshold,
   wherein the detection module is further configured to determine a predetermined period of low power consumption, and
   wherein in response to the detection module determining the predetermined period of low power consumption, the power provision module is further configured to charge the sealed batteries by pulling power from the main power supply and from a renewable power supply based on a predetermined ratio between the main power supply and the renewable power supply.

2. The battery cabinet of claim 1, wherein the battery cabinet is part of a system comprising the battery cabinet and further comprising:
   a plurality of server cabinets co-located with the battery cabinet, wherein a respective server cabinet includes at least one of the computing devices.

3. The battery cabinet of claim 1, further comprising:
   a plurality of fans; and
   a modular uninterruptible power supply unit coupled to the power management module and configured to draw power from the sealed batteries and provide the drawn power via the power outlet to the one or more computing devices.

4. The battery cabinet of claim 1, wherein a respective sealed battery comprises a plurality of parallel battery strings, and wherein a respective battery string comprises:
   battery cells;
   a plurality of pairs comprised of the battery cells and corresponding switches, wherein the plurality of pairs is coupled to a ground, and wherein a first battery cell and a corresponding first switch comprise a respective pair in the plurality of pairs; and
   a voltage regulator module coupled to the plurality of pairs,
   wherein the first switch is configured to bypass the first battery cell in response to a failure of the first battery cell.

5. The battery cabinet of claim 4, wherein the battery cells comprise functioning battery cells from retired batteries, wherein a respective retired battery is previously used in one or more of:
   an industrial context;
   an electric vehicle;
   a hybrid vehicle; and a manner which leaves some non-functioning battery cells and at least one functioning battery cell in the respective retired battery.

6. The battery cabinet of claim 1, wherein the predetermined period of low power consumption corresponds to a least expensive electricity rate.

7. The battery cabinet of claim 1, wherein the renewable power supply includes one or more of:
   wind power;
   rainfall power;
   water-related power;
   solar energy; and
   tidal power.

8. The battery cabinet of claim 1, wherein the renewable power supply is generated from a source which is located within a predetermined distance from the battery cabinet.

9. A computer-implemented method, comprising:
   monitoring a first amount of power consumed by one or more computing devices via a main power supply;
   detecting that the first amount of power consumption exceeds a predetermined power consumption threshold;
   providing, via a plurality of sealed batteries, power to a power outlet until the first amount of power consumption no longer exceeds the predetermined power consumption threshold;
   determining a predetermined period of low power consumption; and
   in response to determining the predetermined period of low power consumption, charging the sealed batteries by pulling power from the main power supply and from a renewable power supply based on a predetermined ratio between the main power supply and the renewable power supply,
   wherein monitoring, detecting, providing, determining, and charging are performed by a power management module of a battery cabinet, wherein the power management module is coupled to the sealed batteries and the power outlet.

10. The method of claim 9, wherein the battery cabinet is part of a system comprising the battery cabinet and further comprising:
    a plurality of server cabinets co-located with the battery cabinet, wherein a respective server cabinet includes at least one of the computing devices.

11. The method of claim 9, wherein prior to monitoring the first amount of power, the method further comprises:
    assembling the plurality of sealed batteries, wherein a respective sealed battery comprises a plurality of parallel battery strings;
    assembling the battery cabinet, which comprises:
      the assembled plurality of sealed batteries;
      the power outlet;
      a plurality of fans;
      a power management module configured to perform the monitoring, detecting, and providing, wherein the power management module is coupled to the sealed batteries and the power outlet; and
      a modular uninterruptible power supply unit coupled to the power management module and configured to draw power from the sealed batteries and provide the drawn power via the power outlet to the one or more computing devices;
    coupling the power management module to the sealed batteries and the power outlet; and
    coupling the power outlet to the one or more computing devices.

12. The method of claim 11, wherein a respective battery string comprises:
    battery cells;
    a plurality of pairs comprised of the battery cells and corresponding switches, wherein the plurality of pairs is coupled to a ground, and wherein a first battery cell and a corresponding first switch comprise a respective pair in the plurality of pairs; and
    a voltage regulator module coupled to the plurality of pairs,
    wherein the first switch is configured to bypass the first battery cell in response to a failure of the first battery cell.

13. The method of claim 12, wherein the battery cells comprise functioning battery cells from retired batteries, wherein a respective retired battery is previously used in one or more of:
    an industrial context;
    an electric vehicle;
    a hybrid vehicle; and
    a manner which leaves some non-functioning battery cells and at least one functioning battery cell in the respective retired battery.

14. The method of claim 9, wherein the predetermined period of low power consumption corresponds to a least expensive electricity rate.

15. The method of claim 9,
    wherein the renewable power supply includes one or more of:
      wind power;
      rainfall power;
      water-related power;
      solar energy; and
      tidal power.

16. The method of claim 9, wherein the renewable power supply is generated from a source which is located within a predetermined distance from the battery cabinet.

17. A data center, comprising:
    a plurality of battery cabinets, wherein a respective battery cabinet comprises a plurality of sealed batteries and a power management module which is coupled to the plurality of sealed batteries and a power outlet;
    a plurality of server cabinets coupled to at least one of the battery cabinets, wherein a respective server cabinet comprises a plurality of computing devices;
    a processor; and
    a memory coupled to the processor and storing instructions, which when executed by the processor cause the processor to perform a method, the method comprising:
      monitoring a first amount of power consumed by one or more computing devices via a main power supply;
      detecting that the first amount of power consumption exceeds a predetermined power consumption threshold;
      providing, via the plurality of sealed batteries, power to the power outlet until the first amount of power consumption no longer exceeds the predetermined power consumption threshold;
      determining a predetermined period of low power consumption; and
      in response to determining the predetermined period of low power consumption, charging the sealed batteries by pulling power from the main power supply and from a renewable power supply based on a predetermined ratio between the main power supply and the renewable power supply.

* * * * *